United States Patent [19]

Pudlosky

[11] 4,327,325

[45] Apr. 27, 1982

[54] CHUCK FOR USE IN TESTING OF SEMICONDUCTOR PELLETS

[75] Inventor: Joseph P. Pudlosky, Hunlocks Creek, Pa.

[73] Assignee: RCA Corporation, New York, N.Y.

[21] Appl. No.: 81,194

[22] Filed: Oct. 2, 1979

Related U.S. Application Data

[63] Continuation of Ser. No. 852,085, Nov. 16, 1977, abandoned.

[51] Int. Cl.³ .............................................. G01R 1/06
[52] U.S. Cl. .............................. 324/158 F; 324/158 P
[58] Field of Search ............... 324/158 F, 158 P, 72.5; 361/301, 302, 303, 307

[56] References Cited

U.S. PATENT DOCUMENTS 4,104,589  8/1978  Baker et al. ..................... 324/158 F Primary Examiner—Ernest F. Karlsen
Attorney, Agent, or Firm—Birgit E. Morris; Donald S. Cohen; Robert Ochis

[57] ABSTRACT

A chuck for use in the testing of semiconductor pellets comprising first and second electrically conductive members alternately arranged to provide a wafer receiving surface. The members are substantially completely electrically isolated from each other. An electric power lead and a measurement sensing lead are provided to the first and second conductive members, respectively.

12 Claims, 3 Drawing Figures

TO POWER SOURCE
TO MEASUREMENT APPARATUS

CHUCK FOR USE IN TESTING OF SEMICONDUCTOR PELLETS

This is a continuation of application Ser. No. 852,085, filed Nov. 16, 1977, now abandoned.

The present invention generally relates to the testing of semiconductor device pellets and, in particular, relates to a chuck which permits increased accuracy of the results of those tests.

One step in the processing of semiconductor devices is to perform electrical tests on the device pellets. One type device, for example, is a conventional thyristor wherein the anode region and the base region thereof of several devices are common to each other prior to pellet separation. As a result, each device pellet must be tested individually to insure that it meets the required electrical characteristics. The usual electrical testing process is to place a semiconductor pellet on a conventional chuck having the common anode contact of the pellet interfacing therewith. The conventional chuck is usually a solid brass cylinder. Sets of gate and cathode probes are then brought into contact with those respective regions of the pellet to be tested. Each set of probes i.e., gate or cathode, is generally comprised of two leads which are electrically isolated from each other. One lead of each pair is utilized to provide power to the pellet while the other lead is a measurement sensing lead connected to a measuring apparatus. The pair of probes for the anode region, however, are only electrically isolated from each other external to the perimeter of the chuck. That is, the anode probes can be considered as being merged into a single conductive path throughout the chuck. Hence, the current in the anode power lead also flows in the anode measurement sensing lead through the chuck. This commonality of leads introduces errors which make the measurements rather coarse. The coarseness of these measurements is evidenced by the fact that while many defective device pellets are found at this stage of testing, a substantial number of defective devices are discovered only after the pellets have been packaged. This number of defective pellets i.e., those found during the electrical testing after packaging, represent a considerable value in both time and money spent in the packaging steps.

A chuck which substantially provides electrical isolation between power and sensing leads in a chuck is described and discussed in U.S. Patent Application Ser. No. 730,332 filed Oct. 7, 1976 now U.S. Pat. No. 4,104,589, which is assigned to the assignee of the present invention. However, such a chuck is generally rather massive and would be difficult to fabricate for single pellet testing. A structure embodying the principles of the present invention provides a chuck which can be utilized to accurately determine the electrical characteristics of individual semiconductor pellets.

Figure 1:
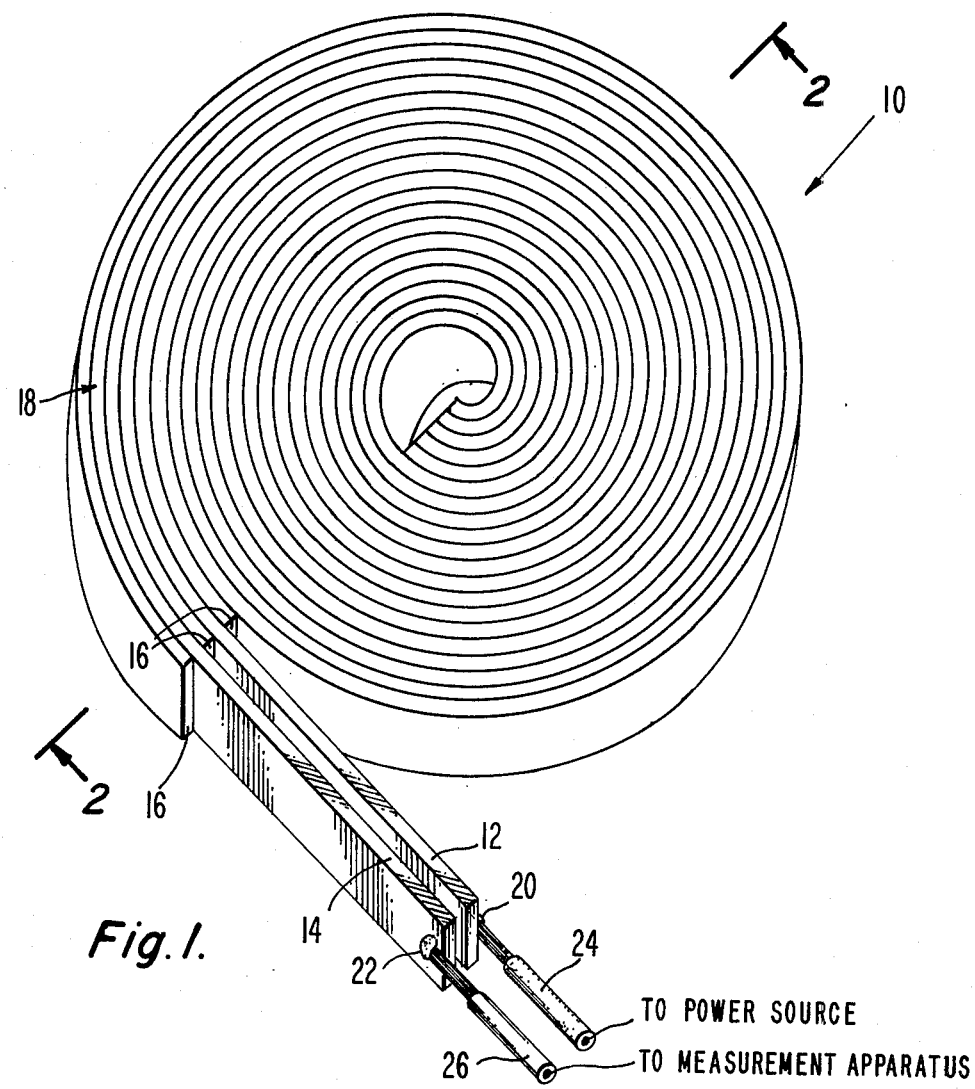
FIG. 1 is a perspective view of a chuck, not drawn to scale, embodying the principles of the present invention.
Figure 2:
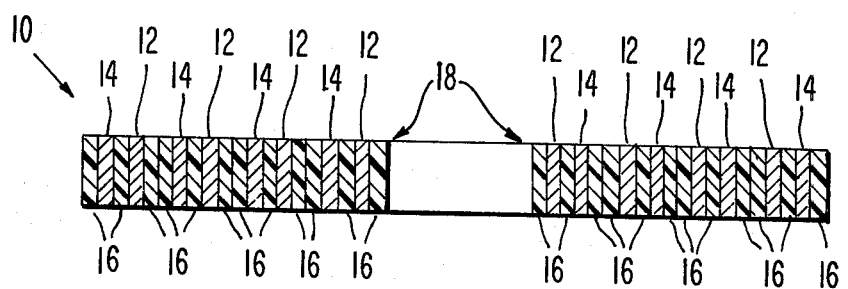
FIG. 2 is a cross-sectional view of the chuck shown in FIG. 1 taken along the line 2—2 thereof.

A novel chuck, indicated generally at 10 in the drawing, embodying the principles of the present invention comprises first and second electrically conductive members, 12 and 14 respectively, in a tightly wrapped configuration. While the first and second members 12 and 14 are shown as strips in the drawing, it will be understood that they could just as well be conductive wires, or the like. The first and second members 12 and 14 respectively, are substantially completely electrically isolated from each other by at least two layers 16 of insulating material between which is sandwiched at least one of the first and second conductive members 12 or 14. In the preferred embodiment, there are three layers 16 of insulating material which alternate with, and thus sandwich, both the first and second conductive members 12 and 14 therebetween.

Figure 3:
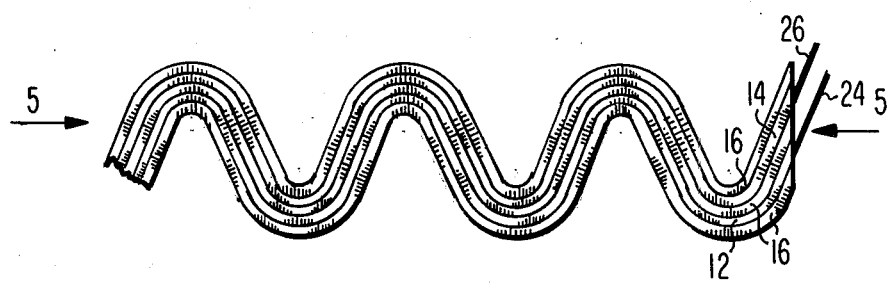
FIG. 3 is a plan view of an alternative means of forming a chuck in accordance with this invention.

The first and second members 12 and 14 respectively, are arranged in such a fashion that a pellet mounting surface 18 is provided. For example, the members 12 and 14 can be wrapped about an axis. Preferably, in this example, the pellet mounting surface 18 is substantially perpendicular to the axis about which the first and second members 12 and 14 respectively, are wrapped. Alternatively, the first and second members 12 and 14 can be shaped in the form of a sinusoid as illustrated in FIG. 3. Preferably, in this example, the sinusoid is compressed into an accordian fold as indicated by arrow 5 to form a somewhat rectangular surface. In the above configurations, the conductor 12 and the conductor 14 are each lapped with respect to themselves meaning that in each example a straight line can be drawn on the surface 18 which will intersect each conductor more than once. It is to be noted that other shapes and configurations can be used in forming the conductors 12 and 14 into the pellet mounting surface 18.

A first and second electrical connectors 20 and 22 respectively, are attached in an electrically conductive fashion to the first and second conductive members, 12 and 14, respectively, Any form of electrical connector, known in the art, including a direct solder joint, can be used for the first and second connectors 20 and 22, respectively.

An electric power source lead 24 is electrically connected to, via the first connector 20, the first member 12. Similarly, a measuring lead 26 is electrically connected to, via the second connector 22, the second member 14.

The chuck 10 can be fabricated by using two relatively thin, elongated, conductive members 12 and 14. Although any electrically conductive material can be used, brass is generally preferred because it has good heat dissipating properties as well as adequate electrical characteristics. For example, in order to provide a one or two inch diameter receiving surface 18, strips of brass about two feet long can be utilized. Although the width of the strips are not critical a width of about one centimeter is sufficient. Preferably, for ease of wrapping, the thickness of the brass members 12 and 14 is on the order of about 13 millimeters. The brass members 12 and 14 are interleaved with layers 16 of insulating material which is about the same length and width. Preferably, also for ease of wrapping and to provide an optimum amount of conductive material at the receiving surface 18, the layers 16 of insulating material are also relatively thin, for example, on the order of about 10 millimeters. While any electrically insulating material can be utilized a polyvinyl material which is treated to be adhesive is preferred, such as types available from the 3M Company of St. Paul, Minn. In such an instance the adhesive assists in the retention of the members 12 and 14 in the desired shape and tightness of the windings. As an alternative to the use of discrete layers 16 of insulating material, each of the brass members 12 and 14 can be sprayed with an insulating lacquer, for example of the type used in motor windings prior to the wrapping thereof. By using such a lacquer insulation is provided between the members 12 and 14 yet a relatively close spacing is retained. In such a structure the pellet receiving surface 18 would then contain a considerably larger percentage of conductive material which results in a more uniform contact between the chuck 10 and the pellet under test.

Once the sandwich has been formed, i.e., the interleaving of layers 16 of insulating material and the first and second members 12 and 14, it is wrapped, preferably in the general shape of a circle, although other shapes, i.e., triangles or rectangles, can also be used, as tightly as necessary to provide the pellet receiving surface 18. For example, the winding can be wrapped by hand or by the use of an electrical apparatus similar to an electric drill. It is preferred that the surface 18 be formed such that it is substantially perpendicular to the axis about which the sandwich is wound. Such a configuration permits the relatively easy jigging of the chuck 10 with respect to any probes used in the testing process. In the embodiment wherein a spray lacquer has been utilized the pellet receiving surface 18 formed must be mechanically ground or chemically etched to remove the lacquer from the surface portion of the conductive members 12 and 14. In such a case, an external retaining ring (not shown) can be utilized to retain the shape of the chuck 10 and to prevent it for unwinding or loosening up.

After the formation of the surface 18, in either alternative, grinding may be necessary in order to insure that the pellet receiving surface 18 is substantially flat. This step insures that there is good electrical contact between the surface 18 and the pellet to be measured, thus insuring more accurate measurements.

While the principles of the present invention have been discussed to this point as forming a pellet testing chuck 10, the first and second members, 12 and 14 respectively, and the layers 16 of insulating material can easily be made sufficiently long that the resulting receiving surface 18 is large enough to accommodate a full multi-pellet semiconductor wafer (not shown). In such a case, the measurements are improved over a solid brass chuck.

In operation, the electric power source lead 24 which is electrically connected to the first member 12 by the first connector 20 is connected to one terminal of a power source which provides the power which exercises the pellet under test. The measuring lead 26 which is connected to the second member 14 by the second connector 22 is connected to a sensing input of the test system which controls the exercising of the pellet under test. The pellet under test is placed on the pellet mounting surface 18 of the chuck 10. The surface of the pellet in contact with the mounting surface 18 makes electrical contact to both the first member 12 and the second member 14. If the pellet is a thyristor, the anode will generally be in contact with surface 18. As in the prior art, appropriate sets of contact probes such as gate and cathode probes in the case of thyristors are then brought in contact with the corresponding regions of the pellet under test. Where kelvin testing is being performed, as is preferred, the gate probe and the cathode probe will each contain two electrically isolated conductors. A first one of the conductors of each probe will carry the power of excitation signal which is to exercise the pellet under test to that contact of the pellet under test. A second lead of each of these probes will carry a sensing signal from that contact of the pellet to the appropriate sensing signal input terminal of the test system.

By providing a power source lead and a measurement sensing lead, which are electrically isolated from each other at the point of contact between the chuck 10 and the pellet under test, the chuck 10 permits the accurate measurement of individual semiconductor device pellets at a relatively early stage of the overall fabrication thereof. Thus, defective pellets are substantially eliminated from the packaging operation and considerable time and effort is conserved. In addition, since such test results closely match those made on final packaged devices, the pellets can be stored and utilized only as needed or required. That is, the individual pellets need not be packaged immediately, tested and then stored; rather the pellets themselves can be stored for future use. This form of storage conserves considerable space since the size of the package is not involved.

What is claimed is:

1. A chuck for use in testing semiconductor pellets, said chuck comprising:

a first electrically conductive elongated member having a length, said first elongated member having a cross-section which is substantially uniform along substantially the entire length of said first member;

a second electrically conductive elongated member having a length, said second elongated member having a cross-section which is substantially uniform along substantially the entire length of said second member;

electrical isolation means electrically isolating said first and second elongated members from each other and for isolating adjacent portions of each of said first and second members;

said first and second elongated members and said electrical isolation means arranged together in a lapped configuration to form a substantially planar pellet receiving surface such that a straight line can be drawn thereon which will intersect each of said first and second elongated members more than once, each of said members having a contact portion which is exposed as a part of said pellet receiving surface for making electrical contact with a pellet placed on said pellet receiving surface;

means for connecting a power lead to said first member whereby during pellet testing said contact portion of said first members constitutes an input power contact to said chuck and said means for connecting a power lead constitutes an output power contact from said chuck; and means for connecting a sensing lead to said second member whereby during pellet testing said contact portion of said second member constitutes an input sensing contact to said chuck and said means for connecting a sensing lead constitutes an output sensing contact from said chuck.

2. A chuck as claimed in claim 1 wherein:
said first and second members are elongated strips of a conductive material having length, width and thickness, said width comparatively shorter than said length, and said thickness comparatively smaller than said width, said width being substantially transverse to said pellet receiving surface.

3. A chuck as claimed in claim 1 wherein:

said first and second members are elongated brass strips having a thickness less than about 13 millimeters.

4. A chuck as claimed in claim 1 wherein said means for electrically isolating conductors comprises:
   a first flexible layer of insulating material between said first and second conductors; and
   a second layer of insulating material adjacent said first conductor whereby said first member is sandwiched between said first layer of insulating material and said second layer of insulating material.

5. A chuck as claimed in claim 4 wherein:
   said first and said second layer of insulating material are adhesive.

6. A chuck as claimed in claim 4 further comprising:
   a third layer of insulating material adjacent said second member whereby said second member is sandwiched between said second layer of insulating material and said third layer of insulating material.

7. A chuck as claimed in claim 6 wherein:
   said first, second and third layers of insulating materials are adhesive.

8. A chuck as claimed in claim 1 wherein said means electrically isolating said conductors comprises:
   a coating of lacquer on said first and second members covering all but the surface intercepts thereof.

9. A chuck as claimed in claim 1 wherein:
   said first and second conductive members are wrapped about an axis and said pellet receiving surface is substantially circular; and
   said surface being substantially perpendicular to said axis.

10. A chuck as claimed in claim 1 wherein:
    said first and second members are elongated brass strips having a thickness at least on the order of about 13 millimeters thick.

11. A chuck as claimed in claim 2 wherein said first and second members are brass.

12. A chuck as claimed in claim 1 wherein said first and second conductive members are shaped in the form of a sinusoid.

* * * * *